United States Patent
Zhang et al.

(10) Patent No.: US 12,154,905 B2
(45) Date of Patent: Nov. 26, 2024

(54) ARRAYED SWITCH CIRCUIT, SWITCHING ELEMENT AND SYSTEM CHIP PACKAGE STRUCTURE

(71) Applicant: INDUSTRIAL TECHNOLOGY RESEARCH INSTITUTE, Hsinchu (TW)

(72) Inventors: Jie Zhang, New Taipei (TW); Tai-Hsing Lee, Hsinchu (TW); Sih-Han Li, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 640 days.

(21) Appl. No.: 17/372,132

(22) Filed: Jul. 9, 2021

(65) Prior Publication Data
US 2022/0344371 A1    Oct. 27, 2022

(30) Foreign Application Priority Data
Apr. 21, 2021 (TW) .................. 110114328

(51) Int. Cl.
*H01L 27/118*    (2006.01)
*H01L 25/065*    (2023.01)
(Continued)

(52) U.S. Cl.
CPC .... *H01L 27/11898* (2013.01); *H01L 25/0652* (2013.01); *H01L 25/0655* (2013.01);
(Continued)

(58) Field of Classification Search
CPC ........... H01L 27/11898; H01L 25/0652; H01L 24/06; H03K 17/62
See application file for complete search history.

(56) References Cited

U.S. PATENT DOCUMENTS 6,573,549 B1    6/2003 Deng
8,400,778 B2    3/2013 Hsing et al.
(Continued)

FOREIGN PATENT DOCUMENTS

CN    101976951 A    2/2011
CN    107516650 A    12/2017
(Continued)

OTHER PUBLICATIONS

Reszewicz et al. "2.4 GHz LC-VCO with improved robustness against PVT using FD-SOI body biasing technique" IEEE 2018.
(Continued)

*Primary Examiner* — Phat X Cao
(74) *Attorney, Agent, or Firm* — Maschoff Brennan

(57) ABSTRACT

An arrayed switch circuit includes a substrate, signal conductive pads and signal expansion pins. The signal conductive pads are disposed on the substrate at intervals, and the signal conductive pads are arranged to form a signal conductive pad array. Each of the signal conductive pads has a row position and a column position in the signal conductive pad array. A row signal switch is provided between any two adjacent signal conductive pads corresponding to the same row position, and a column signal switch is provided between any two adjacent signal conductive pads corresponding to the same column position. The signal expansion pins are connected to the signal conductive pads located on at least one side of the signal conductive pad array through signal expansion switches respectively.

5 Claims, 11 Drawing Sheets

(51) Int. Cl.
  *H03K 17/60* (2006.01)
  *H03K 17/687* (2006.01)
  *H01L 23/00* (2006.01)

(52) U.S. Cl.
  CPC ......... *H01L 25/0657* (2013.01); *H03K 17/60* (2013.01); *H03K 17/6871* (2013.01); *H01L 24/06* (2013.01); *H01L 24/08* (2013.01); *H01L 2224/06151* (2013.01); *H01L 2224/08137* (2013.01); *H01L 2225/06513* (2013.01); *H01L 2225/06565* (2013.01)

(56) References Cited

U.S. PATENT DOCUMENTS

| | | | |
|---|---|---|---|
| 8,878,599 | B2 | 11/2014 | Negoro |
| 9,106,229 | B1 | 8/2015 | Hutton |
| 9,214,932 | B2 | 12/2015 | Clausen |
| 9,800,285 | B2 | 10/2017 | Li |
| 10,489,544 | B2 | 11/2019 | Lin |
| 10,749,528 | B2 | 8/2020 | Atsatt |
| 11,177,239 | B2 | 11/2021 | Ma et al. |
| 2007/0180338 | A1* | 8/2007 | Becker .............. H01Q 3/247 250/221 |
| 2008/0180129 | A1 | 7/2008 | Nabaa |
| 2015/0381171 | A1 | 12/2015 | Cebi |
| 2016/0181214 | A1* | 6/2016 | Oh .................... H10N 69/00 257/777 |
| 2017/0062294 | A1 | 3/2017 | Nasrullah |
| 2017/0272066 | A1 | 9/2017 | Scott |
| 2019/0006320 | A1* | 1/2019 | Ma .................... H01H 59/0009 |
| 2020/0257352 | A1 | 8/2020 | Hanson |
| 2021/0050052 | A1 | 2/2021 | Okamoto et al. |

FOREIGN PATENT DOCUMENTS

| | | |
|---|---|---|
| CN | 109216292 A | 1/2019 |
| EP | 1533901 A2 | 5/2005 |
| TW | 201937492 A | 9/2019 |
| TW | 202029441 A | 8/2020 |
| TW | 202101468 A | 1/2021 |

OTHER PUBLICATIONS

Wang et al. "A 0.65 mW 2.3-2.5GHz low phase noise LC-VCO with adaptive body biasing technique" IEEE, Nov. 2011.

Iijima et al. "A Technique for High-Speed Circuits On Soi Using Lookahead Type Active Body Bias Control" IEEE 2004.

Hsu et al. "Compact Layout of DT-MOS Transistor With Source-Follower Subcircuit in 90-nm CMOS Technology" IEEE, Apr. 2008.

Lai et al. "Low Power Class-C VCO Using Dynamic Body Biasing" May 2017.

Taiwan Office Action dated Jun. 6, 2022 as received in application No. 111118807.

TW Office Action dated Nov. 2, 2021 as received in Application No. 110114328.

\* cited by examiner

ARRAYED SWITCH CIRCUIT, SWITCHING ELEMENT AND SYSTEM CHIP PACKAGE STRUCTURE

CROSS-REFERENCE TO RELATED APPLICATIONS

This non-provisional application claims priority under 35 U.S.C. § 119(a) on Patent Application No(s). 110114328 filed in Republic of China (ROC) on Apr. 21, 2021, the entire contents of which are hereby incorporated by reference.

BACKGROUND

1. Technical Field

The present disclosure relates to a system chip package structure.

2. Related Art

A conventional system in a package is multiple chips packaged together in an integrated circuit (IC), wherein the connection between the chips in the IC and the connection between I/O pins of the package are formed by routing through a redistribution layer (RDL). After the design of RDL routing is completed, the IC is then manufactured and packaged by an assembly house. Finally, after the packaging is completed, the IC is handed over to a testing house for IC testing. Since the RDL is customized by the assembly house, if the IC is tested by the testing house and found that the RDL routing or chips therein should be modified after the IC has been packaged, the RDL must be redesigned. In this circumstance, the product development time and research and development costs will increase since the longer research and development time is needed. In addition, the assembly house must have a low willingness to accept orders for products with less output.

Accordingly, an improved system chip package structure for overcoming the above-mentioned shortcomings is needed.

SUMMARY

According to one or more embodiments of the present disclosure, an arrayed switch circuit includes a substrate, signal conductive pads and signal expansion pins. The signal conductive pads are disposed on the substrate at intervals, and the signal conductive pads are arranged to form a signal conductive pad array. Each of the signal conductive pads has a row position and a column position in the signal conductive pad array. A row signal switch is provided between any two adjacent signal conductive pads corresponding to the same row position, and a column signal switch is provided between any two adjacent signal conductive pads corresponding to the same column position. The signal expansion pins are connected to the signal conductive pads located on at least one side of the signal conductive pad array through signal expansion switches respectively.

According to one or more embodiments of the present disclosure, a switching element includes a transistor, a first inverter and a second inverter. The transistor includes a gate terminal, a drain terminal, a source terminal and a body terminal, wherein the gate terminal is configured to receive a control signal, and the transistor determines whether the drain terminal and the source terminal are in a conducting or a non-conducting state according to the voltage level of the control signal. The first inverter has a first input terminal and a first output terminal, wherein the first input terminal is connected to the drain terminal. The second inverter has a second input terminal and a second output terminal, wherein the second input terminal is connected to the first output terminal and the second output terminal is connected to the body terminal.

According to one or more embodiments of the present disclosure, a system chip package structure includes a redistribution layer, chips, the arrayed switch circuit as mentioned above and a through silicon via layer. The chips are connected to the redistribution layer, the signal conductive pads of the arrayed switch circuit are connected to the chips through the redistribution layer. The redistribution layer is located above the arrayed switch circuit. The through silicon via layer is connected to the signal conductive pads, and the through silicon via layer is located below the arrayed switch circuit.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
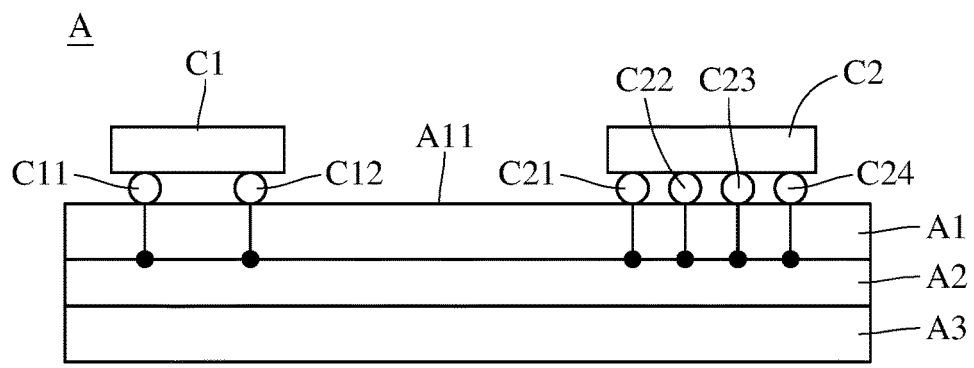
FIG. 1 is a schematic diagram of a system chip package structure of an embodiment of the present disclosure.

FIG. 1 is a schematic diagram of a system chip package structure of an embodiment of the present disclosure. As shown in FIG. 1, the system chip package structure A comprises a first chip C1, a second chip C2, a redistribution layer (RDL) A1, an arrayed switch circuit A2 and a through silicon via (TSV) layer A3. The first chip C1 and the second chip C2 are disposed on the upper surface A11 of the redistribution layer A1, and the arrayed switch A2 is disposed between the redistribution layer A1 and the through silicon via layer A3. The first chip C1, for example, may be provided with a first signal pin C11 and a first power pin C12. The second chip C2, for example, may have a second signal pin C21, a third signal pin C22, a second power pin C23 and a third power pin C24. The first signal pin C11, the first power pin C12, the second signal pin C21, the third signal pin C22, the second power pin C23 and the third power pin C24 are connected to multiple signal conductive pads in different positions of the arrayed switch circuit A2 through multiple conducting wires that are disconnected from each other in the redistribution layer A1 respectively. The signal conductive pads are connected to the through silicon via layer A3. The detailed structure of the arrayed switch circuit A2 is described later.

Figure 2:
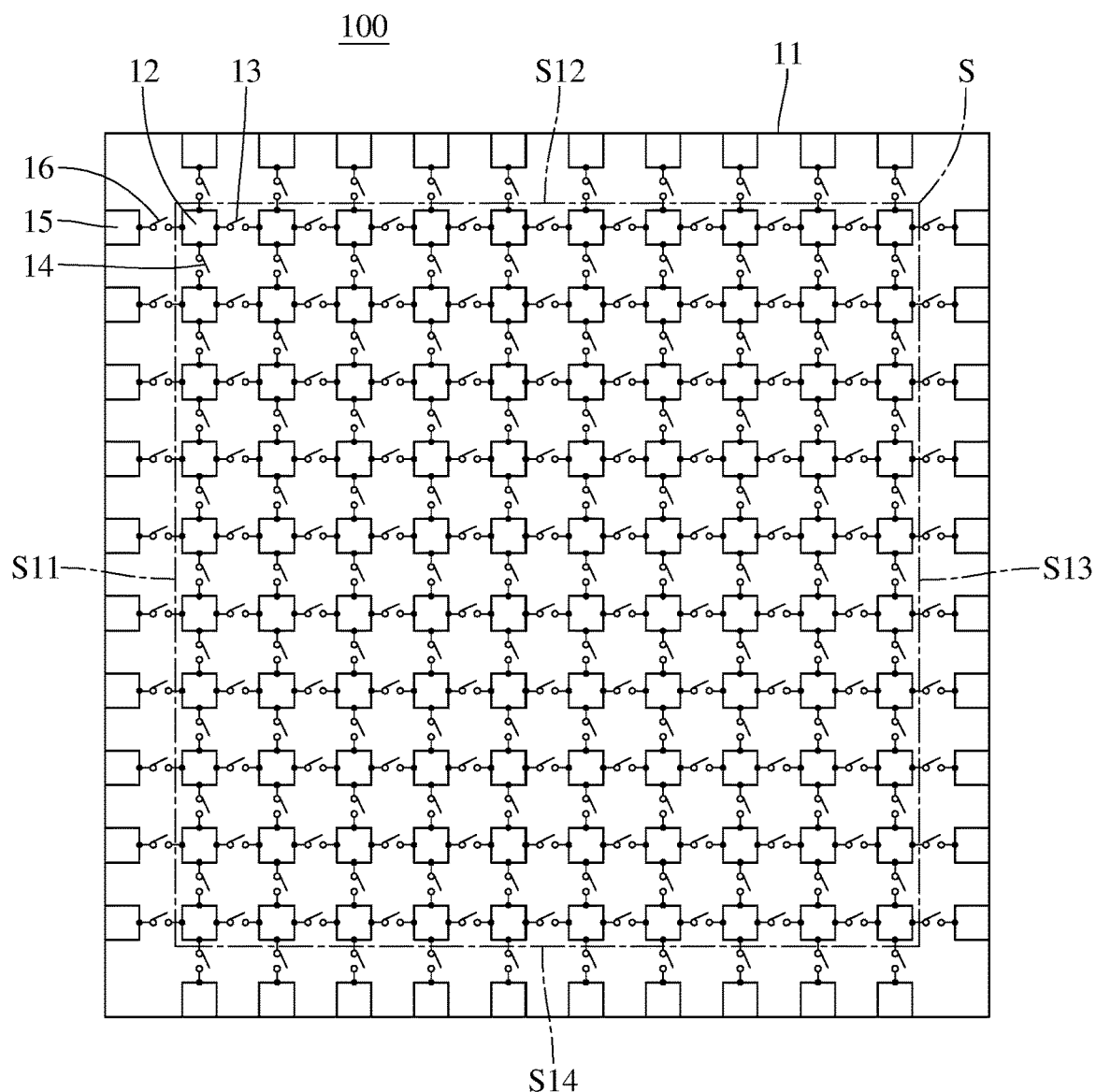
FIG. 2 is a schematic diagram of an arrayed switch circuit of the first embodiment of the present disclosure.

FIG. 2 is a schematic diagram of an arrayed switch circuit of the first embodiment of the present disclosure. As shown in FIG. 2, the arrayed switch circuit 100 of the first embodiment comprises a substrate 11, multiple signal conductive pads 12, multiple row signal switches 13, multiple column signal switches 14, multiple signal expansion pins 15 and multiple signal expansion switches 16, wherein the signal conductive pads 12 are disposed on the substrate 11 at intervals and arranged on the substrate 11 to form a signal conductive pad array S. The signal conductive pad array S comprises a first side S11, a second side S12, a third side S13 and a fourth side S14. The first side S11 is opposite to the third side S13, and the second side S12 is opposite to the fourth side S14. Each of the signal conductive pads 12 has a row position and a column position in the signal conductive pad array S. Regarding the arrangement of the row signal switches 13 and the column signal switches 14 on the substrate 11, there is a row signal switch (one of the row signal switches 13) provided between any two adjacent signal conductive pads 12 corresponding to the same row position, and there is a column signal switch (one of the column signal switches 14) provided between any two adjacent signal conductive pads 12 corresponding to the same column position. Each of the row signal switches 13 and each of the column signal switches 14 are normally in a non-conducting state. When the row signal switch 13 receives a conducting row control signal, the row signal switch 13 switches from the non-conducting state to a conducting state. When the column signal switch 14 receives a conducting column control signal, the column signal switch 14 switches from the non-conducting state to a conducting state.

The signal expansion pins 15 are disposed on the substrate 11 at intervals and close to the first side S11, the second side S12, the third side S13 and the fourth side S14 of the signal conductive pad array S. Two of the signal expansion pins 15 corresponding to the same row position are respectively close to the first side S11 and the third side S13, and two of the signal expansion pins 15 corresponding to the same column position are respectively close to the second side S12 and the fourth side S14.

The signal expansion switches 16 are disposed on the substrate 11 at intervals and close to the first side S11, the second side S12, the third side S13 and the fourth side S14 of the signal conductive pad array S. Two of the signal expansion switches 16 corresponding to the same row position are respectively close to the first side S11 and the third side S13 and two of the signal expansion switches 16 corresponding to the same column position are respectively close to the second side S12 and the fourth side S14. The signal expansion switches 16 make the signal expansion pins 15 be connected to the signal conductive pads 12 arranged on the first side S11, the second side S12, the third side S13 and the fourth side S14.

Figure 3:
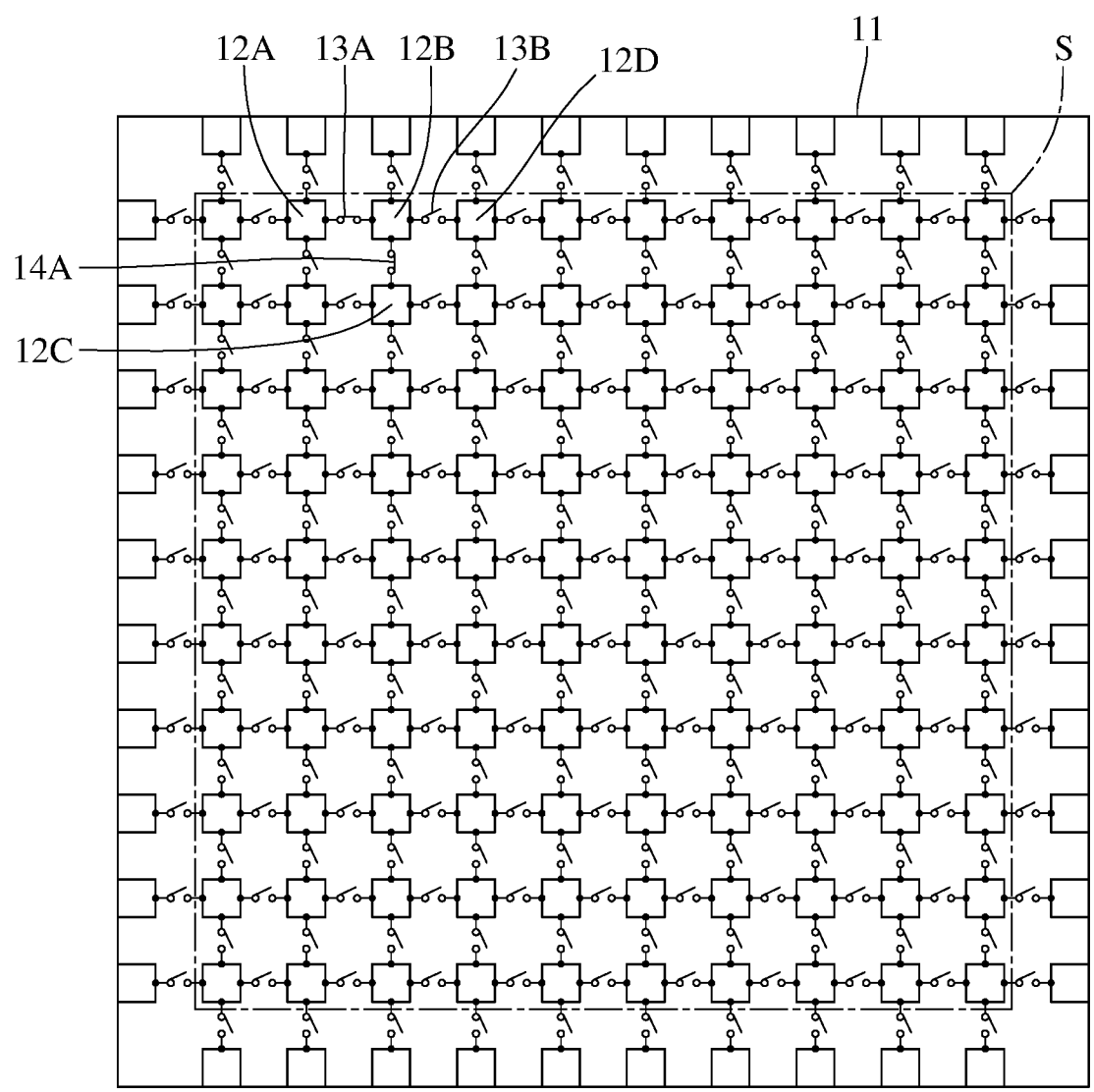
FIG. 3 is a schematic diagram of operation of the arrayed switch circuit in FIG. 2.

FIG. 3 is a schematic diagram of operation of the arrayed switch circuit in FIG. 2. Please refer to FIG. 1 and FIG. 3. A signal conductive pad 12A corresponds to the first row position and the second column position of the signal conductive pad array S and is electrically connected to the first signal pin C11 of the first chip C1. A signal conductive pad 12B corresponds to the first row position and the third column position of the signal conductive pad array S. A signal conductive pad 12C corresponds to the second row position and the third column position of the signal conductive pad array S and is electrically connected to the second signal pin C21 of the second chip C2. A signal conductive pad 12D corresponds to the first row position and the fourth column position of the signal conductive pad array S and is electrically connected to the third signal pin C22 of the second chip C2. A row signal switch 13A is connected between the signal conductive pad 12A and the signal conductive pad 12D. A row signal switch 13B is connected between the signal conductive pad 12B and the signal conductive pad 12D. A column signal switch 14A is connected between the signal conductive pad 12B and the signal conductive pad 12C.

If the application requirement is that the first signal pin C11 of the first chip C1 should be electrically connected to the second signal pin C21 of the second chip C2, merely providing a conducting row control signal and a conducting column control signal to the row signal switch 13A and the column signal switch 14A respectively has to be performed to make the row signal switch 13A and the column signal switch 14A be in the conducting state, and thus, the first signal pin C11 of the first chip C1 is electrically connected to the second signal pin C21 of the second chip C2.

Figure 4:
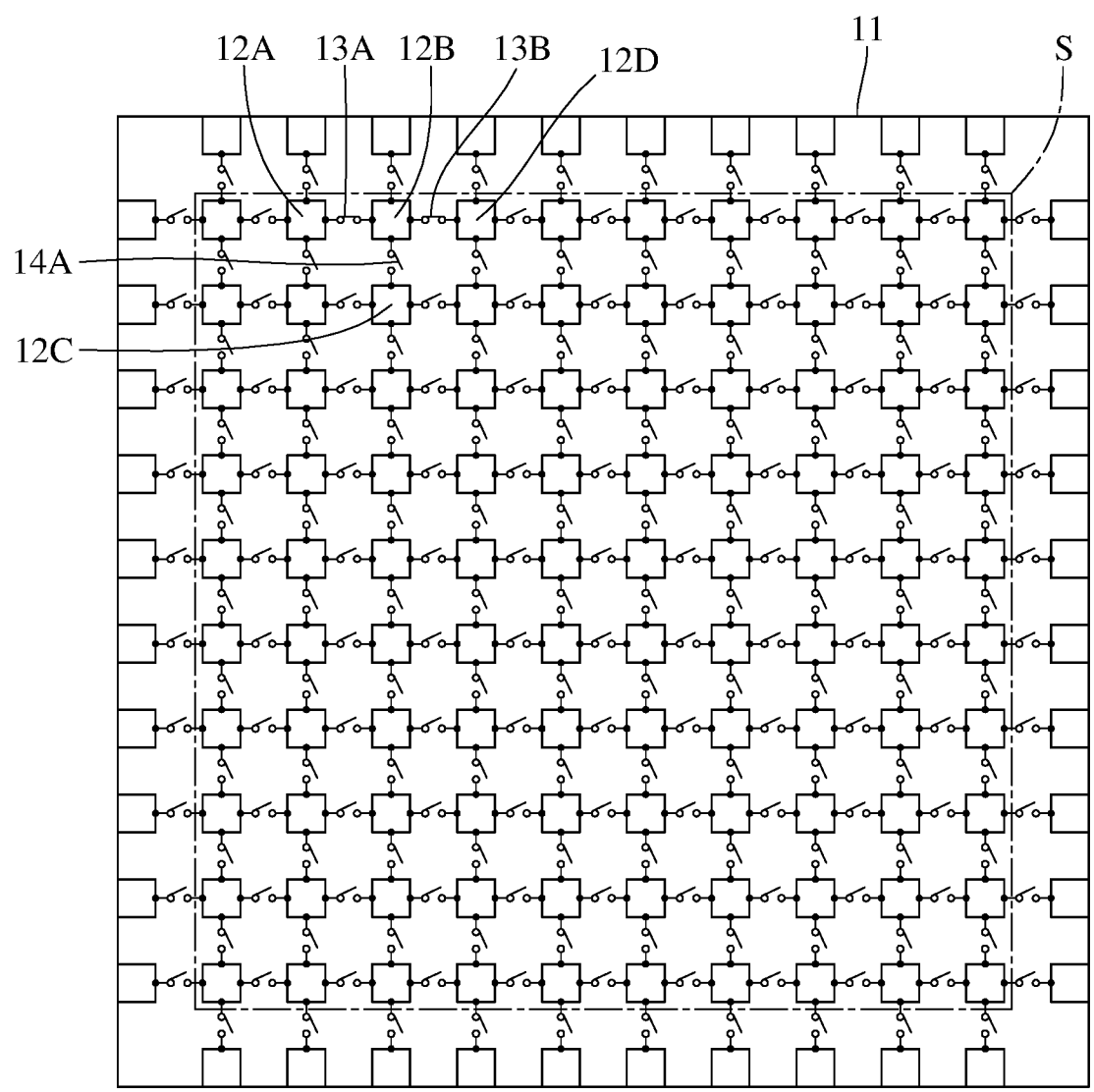
FIG. 4 is another schematic diagram of the operation of the arrayed switch circuit in FIG. 2.

FIG. 4 is another schematic diagram of the operation of the arrayed switch circuit in FIG. 2. Please refer to FIG. 1 and FIG. 4. If the application requirement is that the first signal pin C11 of the first chip C1 should be electrically connected to the third signal pin C22 of the second chip C2, merely providing conducting row control signals to the row signal switch 13A and the row signal switch 13B has to be performed to make the row signal switch 13A and the row signal switch 13B be in the conducting state, and thus, the first signal pin C11 of the first chip C1 is electrically connected to the third signal pin C22 of the second chip C2.

Figure 5:
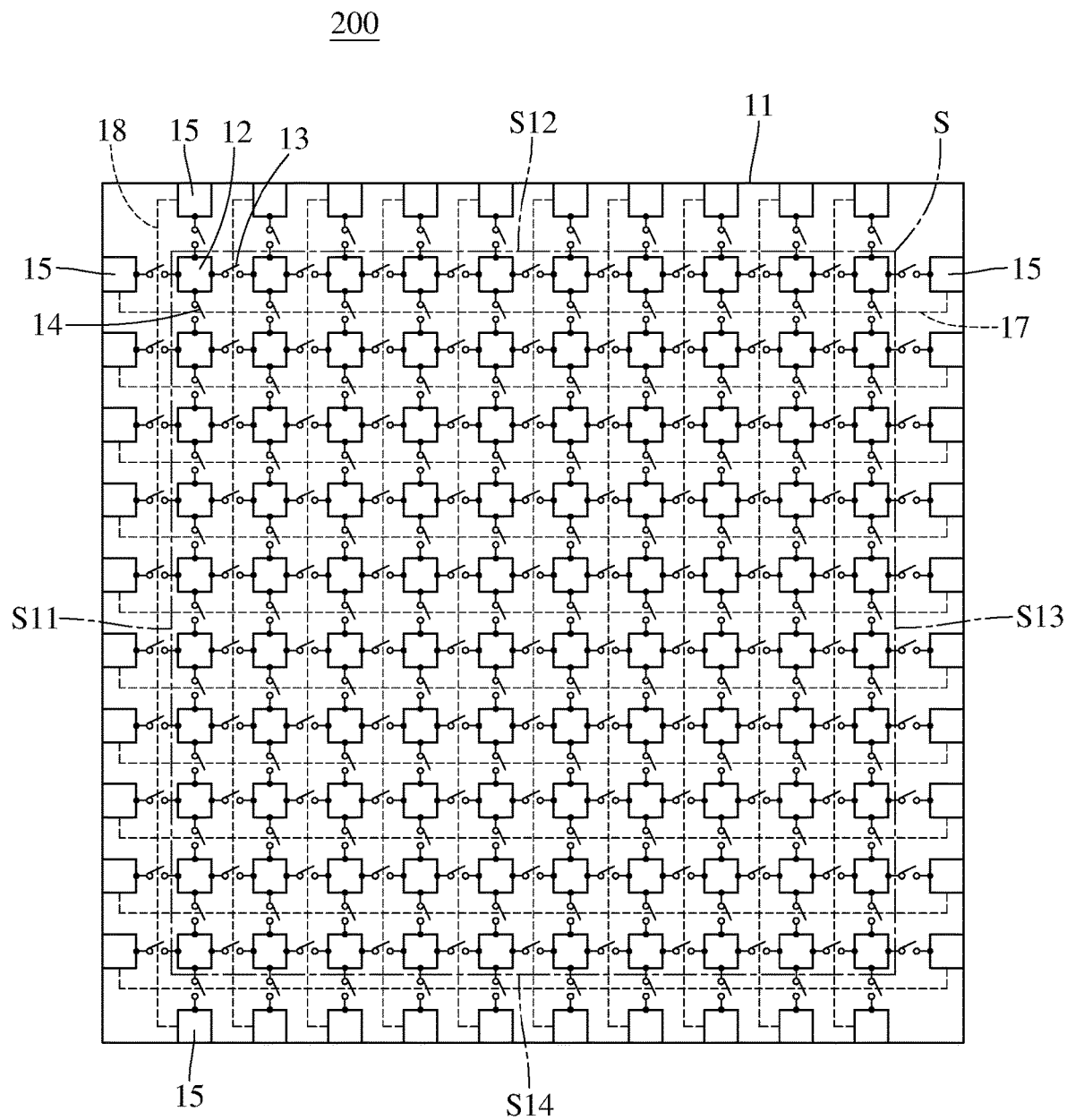
FIG. 5 is a schematic diagram of an arrayed switch circuit of the second embodiment of the present disclosure.

FIG. 5 is a schematic diagram of an arrayed switch circuit of the second embodiment of the present disclosure. Compared to the arrayed switch circuit 100 of the first embodiment, the arrayed switch circuit 200 of the second embodiment further comprises multiple row signal transmission shortcuts 17 and multiple column signal transmission shortcuts 18. The signal expansion pins 15 are disposed on the substrate 11 at intervals and surround the signal conductive pad array S. There is a row signal transmission shortcut (one of the row signal transmission shortcuts 17) is connected between any two of the signal expansion pins 15 corresponding to the same row position, and there is a column signal transmission shortcut (one of the column signal transmission shortcuts 18) is connected between any two of the signal expansion pins 15 corresponding to the same column position.

Regarding the embodiment of FIG. 5, the row signal transmission shortcuts 17 and the column signal transmission shortcuts 18 are high-speed transmission channels in the east-west direction and the north-south direction respectively. If a signal is to be transmitted from the signal conductive pad 12 near the first side S11 of the signal conductive pad array S to the signal conductive pad 12 near the third side S13 of the signal conductive pad array S, the signal has to pass through a lots of row signal switches 13 in a common path, and therefore, the transmission of the signal may have a longer delay, and the signal integrity may be reduced. In contrast, through the setting of the east-west high-speed transmission channels, a row signal merely has to pass through one row signal switch 13 to reach the signal expansion pin 15, then from the signal expansion pin 15 to another signal expansion pin 15 through the high-speed transmission channel, and then through another row signal switch 13, which effectively improving signal transmission performance. Similarly, if a signal is to be transmitted from the signal conductive pad array S of the second side S12 of the signal conductive pad 12 to the signal conductive pad 12 of the fourth side S14 of the signal conductive pad array S, the signal has to pass through a lots of column signal switches 14 in a common path, and therefore, the transmission of the signal may have a longer delay, and the signal integrity may be reduced. In contrast, through the setting of the south-north high-speed transmission channels, a column signal merely has to pass through a column signal switch 14 to reach the signal expansion pin 15, then from the signal expansion pin 15 to another signal expansion pin 15 through the high-speed transmission channel, and then through another column signal switch 14, which effectively improving signal transmission performance.

Figure 6:
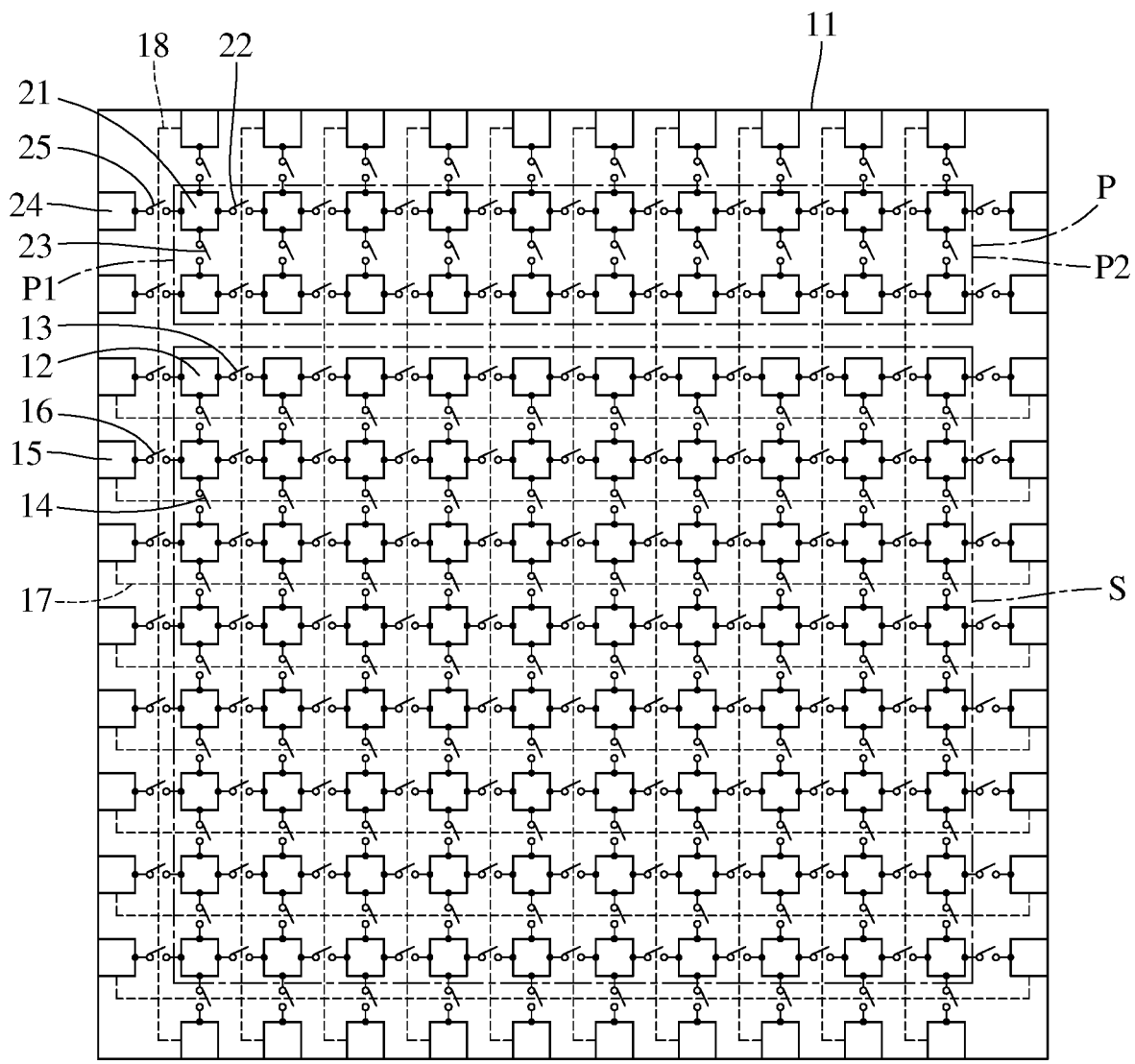
FIG. 6 is a schematic diagram of an arrayed switch circuit of the third embodiment of the present disclosure.

FIG. 6 is a schematic diagram of an arrayed switch circuit of the third embodiment of the present disclosure. As shown in FIG. 6, compared to the arrayed switch circuit 200 in FIG. 5, the arrayed switch circuit 300 of the third embodiment further comprises multiple power conductive pads 21, multiple row power switches 22, multiple column power switches 23, multiple power expansion pins 24 and multiple power expansion switches 25. Therefore, the arrayed switch circuit 300 of the third embodiment is a hybrid switch circuit. The power conductive pads 21 are disposed on the substrate 11 at intervals and arranged to form a power conductive pad array P. The power conductive pad array P and the signal conductive pad array S are electrically isolated from each other and each of the power conductive pads 21 has a row position and a column position in the power conductive pad array P.

Regarding the arrangement of the row power switches 22 and the column power switches 23 on the substrate 11, there is a row power switch (one of the row power switches 22) provided between any two adjacent power conductive pads 21 corresponding to the same row position in the power conductive pad array P, and there is a column power switch (one of the column power switches 23) provided between any two adjacent power conductive pads 21 corresponding to the same column position in the power conductive pad array P. Each of the row power switches 22 and each of the column power switches 23 are normally in a non-conducting state. When the row power switch 22 receives a conducting row control signal, the row power switch 22 switches from the non-conducting state to the conducting state. When the column power switch 23 receives a conducting column control signal, the column power switch 23 switches from the non-conducting state to the conducting state.

The power expansion pins 24 are disposed on the substrate 11 at intervals and close to two opposite sides P1 and P2 of the power conductive pad array P, and two of the power expansion pins 24 corresponding to the same row position are respectively close to the two sides P1 and P2.

The power expansion switches 25 are disposed on the substrate 11 at intervals and close to the two sides P1 and P2 of the power conductive pad array P, and regarding the two power expansion switches 25 at both ends of the same row, one is located between the power conductive pad 21 and the power expansion pin 24 close to the side P1 and the other is located between the power conductive pad 21 and the power expansion pin 24 close to the side P2. The power expansion switches 25 make the power expansion pins 24 be capable of being connected to the power conductive pads 21 arranged on the two sides P1 and P2 respectively.

The embodiment of FIG. 6 belongs to a hybrid switch array. The hybrid switch array comprises a signal type switch matrix and a power type switch matrix separately disposed therein, so that the performance of the various switches may be improved individually according to the functions of the switches. For example, the on-resistance of the row power switches and column power switches used for power supply should be lower, so larger-sized transistors are usually used to form these power switches. The row signal switches and the column signal switches used for signal transmission are usually made of smaller-sized transistors in order to reduce parasitic capacitance.

Figure 7:
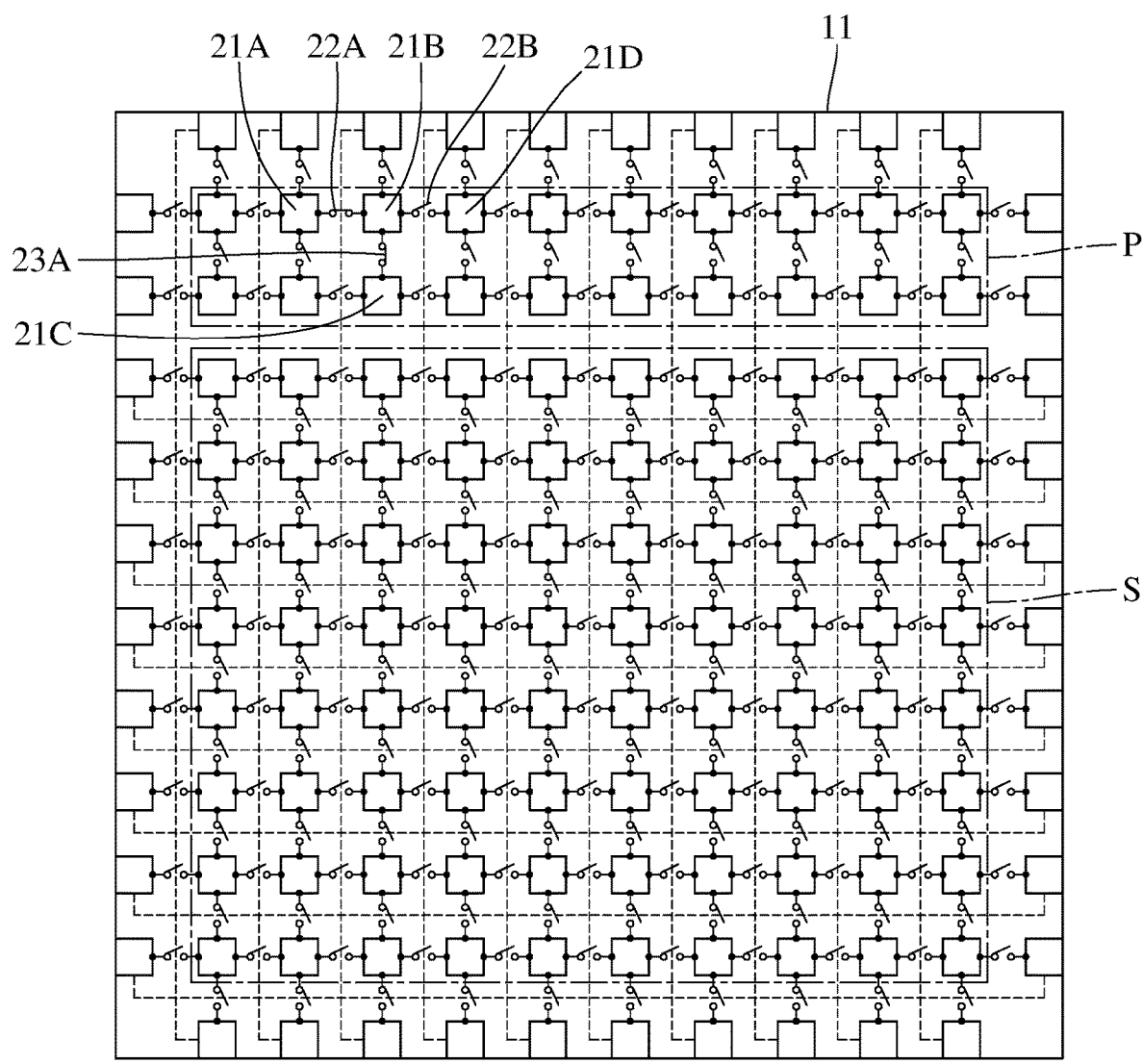
FIG. 7 is a schematic diagram of operation of the arrayed switch circuit in FIG. 6.

FIG. 7 is a schematic diagram of the operation of the arrayed switch circuit in FIG. 6. Please refer to FIG. 1 and FIG. 7. A power conductive pad 21A corresponds to the first row position and the second column position of the power conductive pad array P and is electrically connected to the first power pin C12 of the first chip C1. A power conductive pad 21B corresponds to the first row position and the third column position of the power conductive pad array P. A power conductive pad 21C corresponds to the second row position and the third column position of the power conductive pad array P and is electrically connected to the second power pin C23 of the second chip C2. A power conductive pad 21D corresponds to the first row position and the fourth column position of the power conductive pad array P and is electrically connected to the third power pin C24 of the second chip C2. A row power switch 22A is connected between the power conductive pad 21A and the power conductive pad 21B. A row power switch 22B is connected between the power conductive pad 21B and the power conductive pad 21D. A column power switch 23A is connected between the power conductive pad 21B and the power conductive pad 21C. If the application requirement is that the first power pin C12 of the first chip C1 should be electrically connected to the second power pin C23 of the second chip C2, merely providing a conducting row control signal to the row power switch 22A and providing a conducting column control signal to the column power switch 23A have to be performed to make the row power switch 22A and the column power switch 23A be in the conducting state, and thus, the first power pin C12 of the first chip C1 is electrically connected to the second power pin C23 of the second chip C2.

Figure 8:
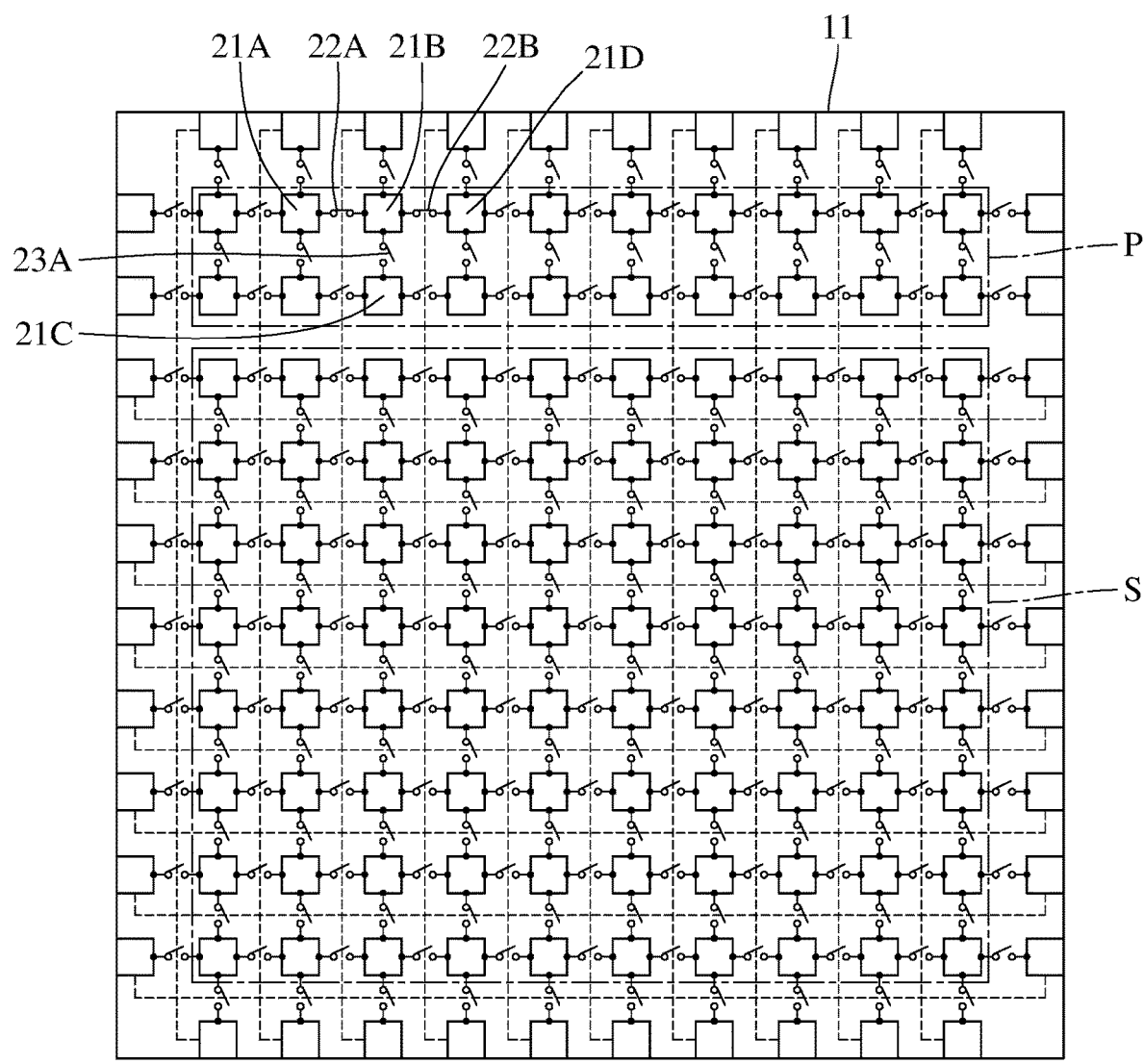
FIG. 8 is another schematic diagram of operation of the arrayed switch circuit in FIG. 6.

FIG. 8 is another schematic diagram of the operation of the arrayed switch circuit in FIG. 6. Please refer to FIG. 1 and FIG. 8. If the application requirement is that the first power pin C12 of the first chip C1 should be electrically connected to the third power pin C24 of the second chip C2, merely providing conducting row control signals to the two row power switches 22A and 22B has to be performed to make the row power switch 22A and the row power switch 22B be in the conducting state, and thus, the first power pin C12 of the first chip C1 is electrically connected to the third power pin C24 of the second chip C2.

Figure 9:
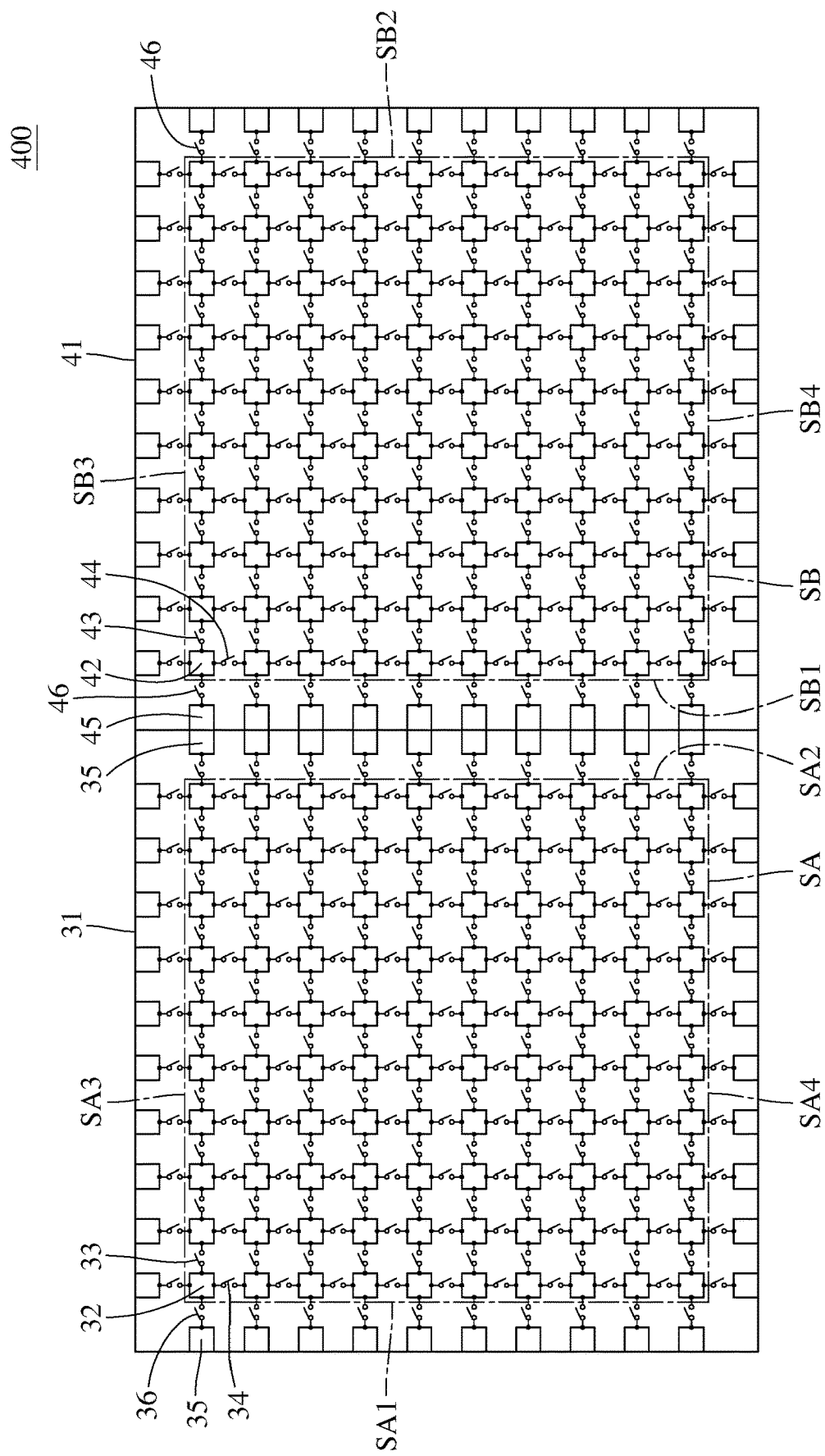
FIG. 9 is a schematic diagram of an arrayed switch circuit of the fourth embodiment of the present disclosure.

FIG. 9 is a schematic diagram of an arrayed switch circuit of the fourth embodiment of the present disclosure. The arrayed switch circuit 400 comprises a first substrate 31 and a second substrate 41. The first substrate 31 and the second substrate 41 are coplanar and connected to each other. Multiple first signal conductive pads 32, multiple first row signal switches 33, multiple first column signal switches 34, multiple first signal expansion pins 35 and multiple first signal expansion switches 36 are disposed on the first substrate 31, wherein the first signal conductive pads 32 are disposed on the first substrate 31 at intervals and arranged to form a first signal conductive pad array SA, and each of the first signal conductive pads 32 has a row position and a column position in the first signal conductive pad array SA. The structure, connection relationship and the operation of the first signal conductive pad array SA are similar to the signal conductive pad array S in FIG. 2, so they are not repeated here.

The first signal conductive pad array SA has four sides SA1-SA4. The first signal expansion pins 35 are disposed on the first substrate 31 at intervals and close to the sides SA1-SA4. Two of the first signal expansion pins 35 corresponding to the same row position respectively close to the two sides SA1 and SA2. Two of the first signal expansion pins 35 corresponding to the same column position are respectively close to the two sides SA3 and SA4.

The first signal expansion switches 36 are disposed on the first substrate 31 at intervals and close to the sides SA1-SA4. Two of the first signal expansion switches 36 corresponding to the same row position are respectively close to the two sides SA1 and SA2. Two of the first signal expansion switches 36 corresponding to the same column position are respectively close to the two sides SA3 and SA4. The first signal expansion switches 36 make the first signal expansion pins 35 be capable of being connected to the first signal conductive pads 32 arranged on the sides SA1-SA4 respectively.

Multiple second signal conductive pads 42, multiple second row signal switches 43, multiple second signal switches 44, multiple second signal expansion pins 45 and multiple second signal expansion switches 46 are disposed on the second substrate 41. The second signal conductive pads 42 are disposed on the second substrate 41 at intervals and arranged to form a second signal conductive pad array SB. The second signal conductive pad array SB has four sides SB1-SB4. Each of the second signal conductive pads 42 has row position and a column position in the second signal conductive pad array SB. The arrangement of the second row signal switches 43, the second signal switches 44, the second signal expansion pins 45 and the second signal expansion switches 46 on the second substrate 41 is similar to the arrangement of the first row signal switches 33, the first column signal switches 34, the first signal expansion pins 35 and the first signal expansion switches 36 on the first substrate 31.

To make the first substrate 31 be electrically connected to the second substrate 41, the first signal expansion pins 35 arranged close to the side SA2 of the first signal conductive pad array SA on the first substrate 31 are connected to the second signal expansion pins 45 arranged on the side SB1 of the second signal conductive pad array SB on the second substrate 41 respectively.

The embodiment of FIG. 9 shows that two signal-type arrayed switches may be combined in the east-west direction on a two-dimensional plane through the signal expansion pins set on the edge as an expansion. However, the expansion of the two signal-type arrayed switches in FIG. 9 is merely an example. In other embodiments of the present disclosure, according to the application requirements, the expansion may be performed on more than two signal-type arrayed switches in east-west direction and/or north-south direction on a two-dimensional plane, or the expansion may be performed on two or more hybrid arrayed switches in east-west and/or north-south direction on a two-dimensional plane. It can be seen that the arrayed switch circuit of the present disclosure has great design flexibility.

Figure 10:
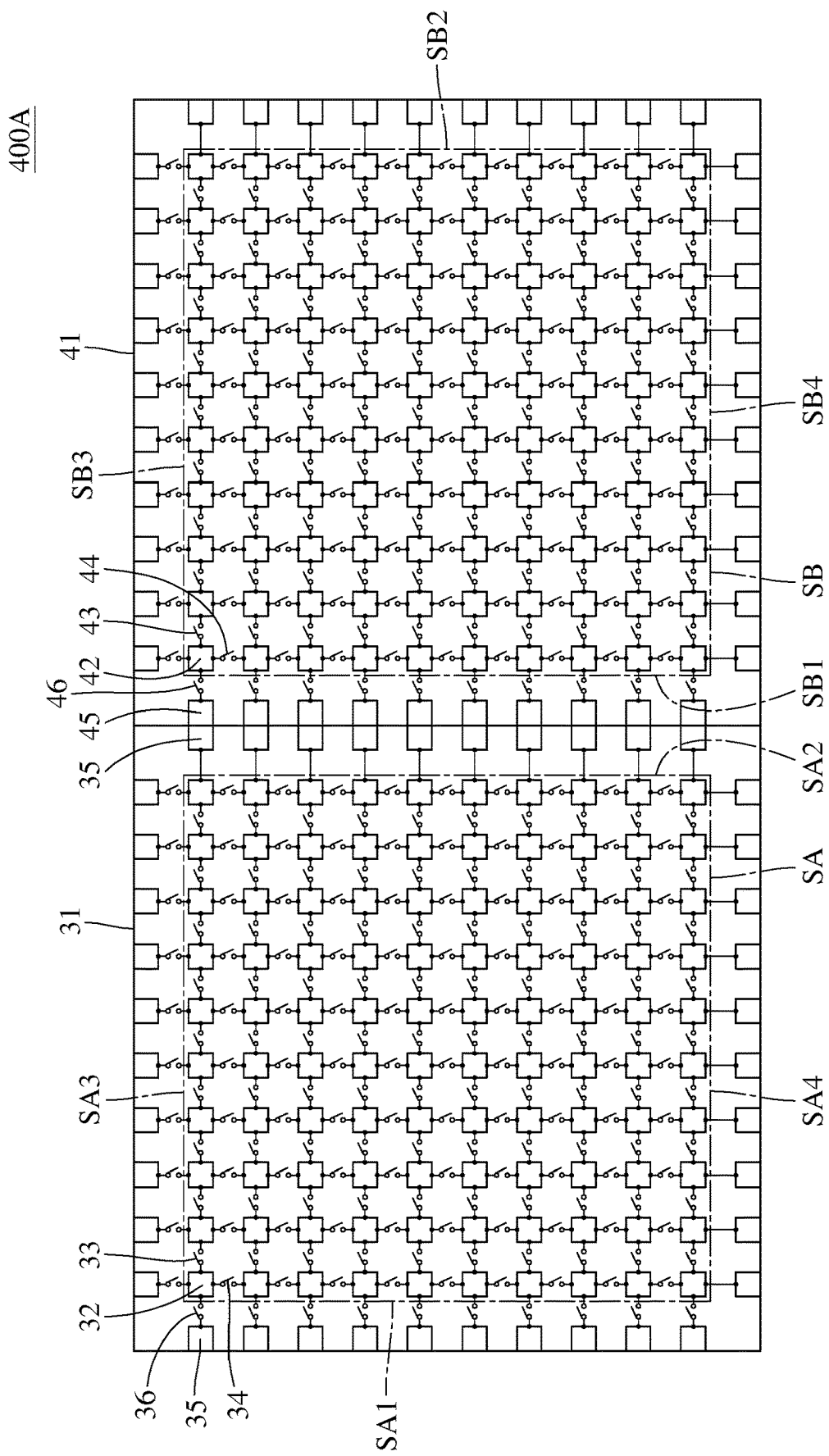
FIG. 10 is a schematic diagram of an arrayed switch circuit of the fifth embodiment of the present disclosure.

FIG. 10 is a schematic diagram of an arrayed switch circuit of the fifth embodiment of the present disclosure. The arrayed switch circuit 400A of the fifth embodiment is substantially the same as the arrayed switch circuit 400 of the fourth embodiment. The difference is that the first signal expansion switches 36 close to the two sides SA2 and SA4 of the first signal conductive pad array SA are removed and replaced by short circuits, and the second signal expansion switches 46 close to the two sides SB2 and SB4 of the second signal conductive pad array SB are removed and replaced by short circuits. In this way, when a signal is transmitted from the first signal conductive pad 32 on the first substrate 31 to the second signal conductive pad 42 on the second substrate 41, or from the second signal conductive pad 42 on the second substrate 41 to the first signal conductive pad 32 on the first substrate 31, the signal does not have to pass through the first signal expansion switch 36 and the second signal expansion switch 46 successively and merely have to pass through the second signal expansion switch 46; thereby, the signal transmission speed may be increased.

Figure 11:
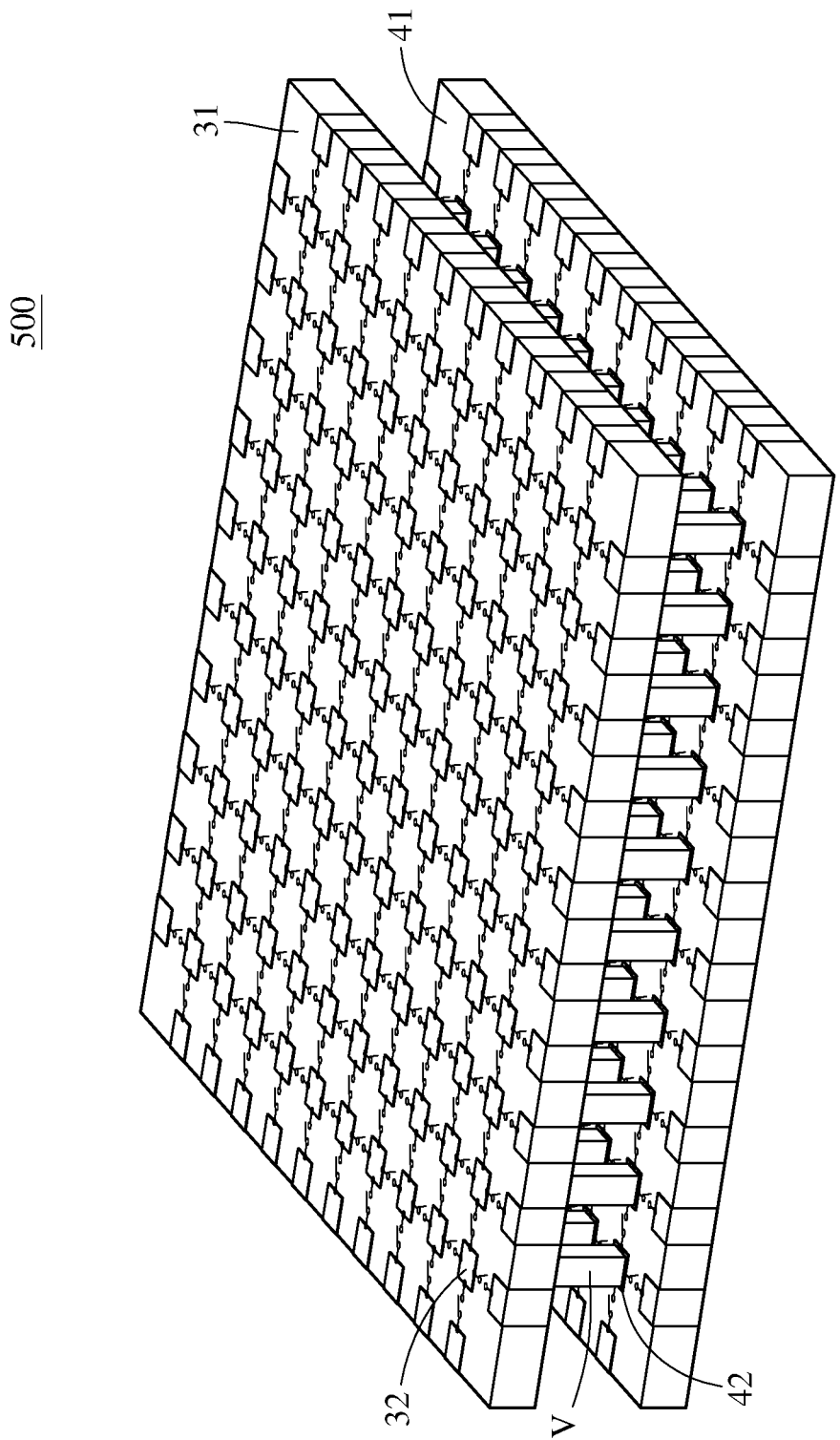
FIG. 11 is a schematic diagram of an arrayed switch circuit of the sixth embodiment of the present disclosure.

FIG. 11 is a schematic diagram of an arrayed switch circuit of the sixth embodiment of the present disclosure. The arrayed switch circuit 500 of the sixth embodiment is substantially the same as the arrayed switch circuit 400 of the fourth embodiment. The difference is that the first substrate 31 and the second substrate 41 are not coplanar but combined longitudinally (e.g. in the direction perpendicular to the first and second substrates 31 and 41) as expansion, and the first signal conductive pads 32 on the first substrate 31 are connected to the second signal conductive pads 42 on the second substrate 41 through multiple conductive vias V respectively.

The embodiment of FIG. 11 shows that the two signal-type arrayed switches may be combined longitudinally in a three-dimensional space through the longitudinally extending conductive vias V. However, the expansion of the two signal-type arrayed switches in FIG. 11 is merely an example. In other embodiments of the present disclosure, according to the application requirements, the longitudinal expansion may be performed on more than two signal-type arrayed switches in three-dimensional space, or the longitudinal expansion may be on two or more hybrid arrayed switches in three-dimensional.

In other embodiments, the expansion may be performed in both the horizontal direction (as shown in FIG. 10) and the vertical direction (As shown in FIG. 11) at the same time through more than two signal-type arrayed switches or hybrid arrayed switches.

Any of the following embodiments of the switching element may be applied to the row signal switch, the column signal switch, the row power switch and the column power switch of the arrayed switch circuit in any of above-mentioned embodiments.

Figure 12:
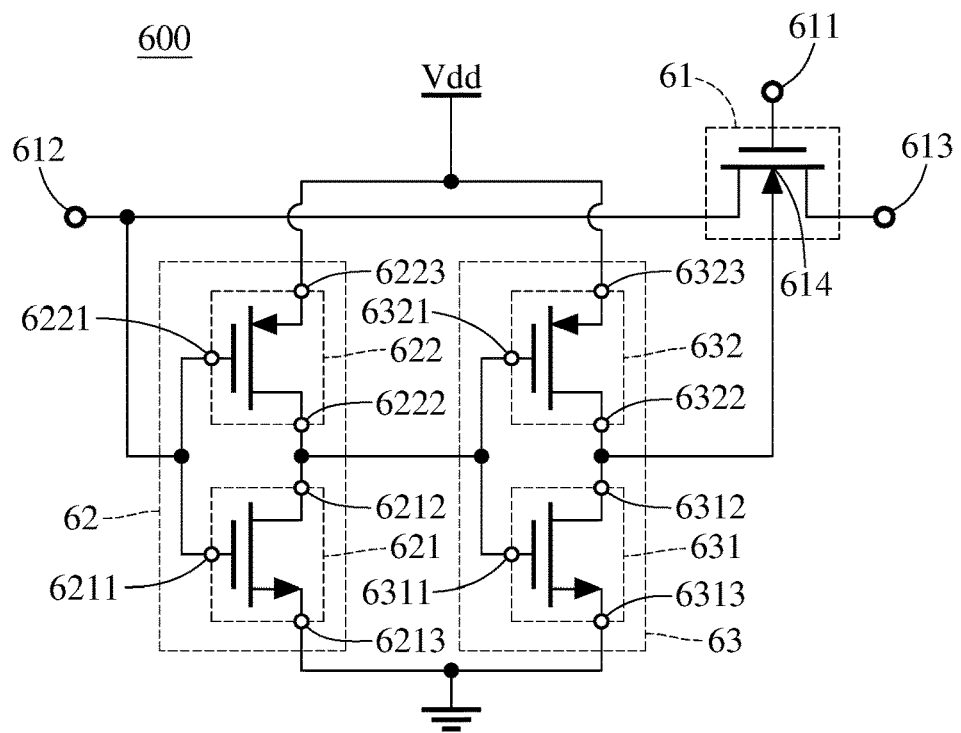
FIG. 12 is a schematic diagram of a switching element of an embodiment of the present disclosure.

FIG. 12 is a schematic diagram of a switching element of an embodiment of the present disclosure. As shown in FIG.

12, a switching element 600 comprises a first transistor 61, a first inverter 62 and a second inverter 63, wherein the combination of the first inverter 62 and the second inverter 63 may be regarded as a buffer. The first transistor 61 is a metal-oxide-semiconductor field-effect transistor (MOSFET) comprising a first gate terminal 611, a first drain terminal 612, a first source terminal 613 and a body terminal 614. The first gate terminal 611 is configured to receive a control signal. The first transistor 61 determines whether the first drain terminal 612 and the first source terminal 613 are in a conducting state or a non-conducting state according to the voltage level of the control signal. Please refer to FIG. 2 and FIG. 12. If the switching element 600 is used as the row signal switch 13 in FIG. 2, the first drain terminal 612 and the first source terminal 613 are connected to two signal conductive pads 12 having the same row position respectively. If the switching element 600 is used as the column signal switch 14 in FIG. 2, the first drain terminal 612 and the first source terminal 613 are connected to two signal conductive pads 12 having the same column position respectively.

The first inverter 62 comprises a second transistor 621 and a third transistor 622. The second transistor 621 is a MOSFET and comprises a second gate terminal 6211, a second drain terminal 6212 and a second source terminal 6213. The third transistor 622 is a MOSFET and comprises a third gate terminal 6221, a third drain terminal 6222 and a third source terminal 6223. The second gate terminal 6211 is connected to the third gate terminal 6221 and the first drain terminal 612, and the second gate terminal 6211 and the third gate terminal 6221 serve as a first input terminal of the first inverter 62. The second drain terminal 6212 is connected to the third drain terminal 6222, and the second drain terminal 6212 and the third drain terminal 6222 serve as a first input terminal of the first inverter 62. The second source terminal 6213 is configured for grounding. The third source terminal 6223 is configured to be connected to a voltage source Vdd.

The second inverter 63 comprises a fourth transistor 631 and a fifth transistor 632. The fourth transistor 631 is a MOSFET and comprises a fourth gate terminal 6311, a fourth drain terminal 6312 and a fourth source terminal 6313. The fifth transistor 632 is a MOSFET and comprises a fifth gate terminal 6321, a fifth drain terminal 6322 and a fifth source terminal 6323. The fourth gate terminal 6311 is connected to the fifth gate terminal 6321 and the fourth gate terminal 6311, and the fifth gate terminal 6321 serve as a second input terminal of the second inverter 63. The second input terminal of the second inverter 63 is connected to the first output terminal of the first inverter 62. The fourth drain terminal 6312 is connected to the fifth drain terminal 6322, and the fourth drain terminal 6312 and the fifth drain terminal 6322 serve as a second output terminal of the second inverter 63. The second output terminal of the second inverter 63 is connected to the body terminal 614 of the first transistor 61. The fourth source terminal 6313 is configured for grounding. The fifth source terminal 6323 is configured to be connected to the voltage source Vdd.

When a input signal is input to the first drain terminal 612 of the first transistor 61 and the first input terminal of the first inverter 62, the input signal may adjust the voltage of the body terminal 614 of the first transistor 61 through the combination of the first inverter 62 and the second inverter 63. According to the formula of the body effects of MOSFET: $V_{th}=V_{to}+r(\sqrt{|-2\varphi_f+V_{sb}|}-\sqrt{|2\varphi_f|})$, when the voltage of the body terminal can be adjusted, the threshold voltage ($V_{th}$) of the MOSFET can be adjusted. According to the current formula of the MOSFET:

$$I_d = \frac{1}{2}u_n C_{ox}\left(\frac{W}{L}\right)(V_{gs}-V_{th}) = \frac{V_d}{R},$$

under the condition of constant $V_d$, when the $V_{th}$ decreases due to the change of the body terminal voltage, $I_d$ can be increased and the resistance (R) can be decreased. According to the formula of time constant: $\tau=RC$, when R decreases, the time constant decreases and the charging and discharging speed of the transistor may be accelerated, so that the channel bandwidth may be broader.

Figure 13:
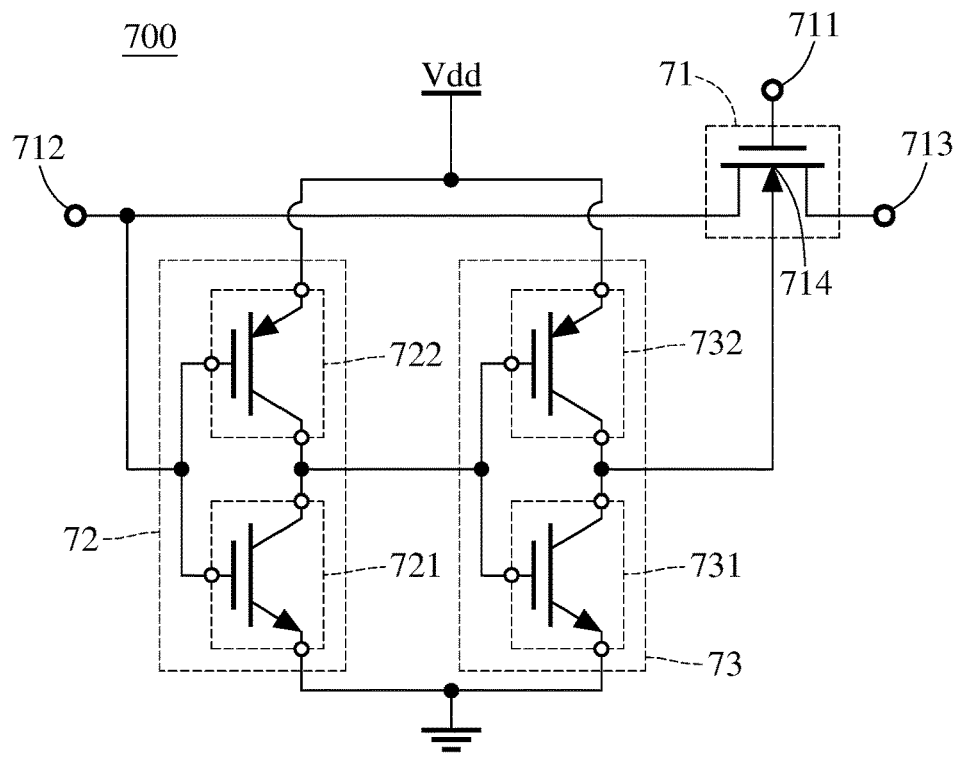
FIG. 13 is a schematic diagram of a switching element of another embodiment of the present disclosure.

FIG. 13 is a schematic diagram of a switching element of another embodiment of the present disclosure. As shown in FIG. 13, the switching element 700 comprises a first transistor 71, a first inverter 72 and a second inverter 73, wherein the combination of the first inverter 72 and the second inverter 73 may be regarded as a buffer. The first transistor 71 is a MOSFET and comprises a first gate terminal 711, a first drain terminal 712, a first source terminal 713 and a body terminal 714. The first gate terminal 711 is configured to receive a control signal, and the first transistor 71 determines whether the first drain terminal 712 and the first source terminal 713 are in a conducting state or a non-conducting state according to the voltage level of the control signal.

The first inverter 72 comprises a second transistor 721 and a third transistor 722. The first inverter 72 is similar to the first inverter 62 in FIG. 12, and the difference therebetween is that the second transistor 721 and the third transistor 722 of the first inverter 72 are all bipolar junction transistors (BJT). The second inverter 73 comprises a fourth transistor 731 and a fifth transistor 732. The second inverter 73 is similar to the second inverter 63 in FIG. 12, and the difference therebetween is that the fourth transistor 731 and the fifth transistor 732 of the second inverter 73 are all bipolar junction transistors.

When the connection between the chips in the system chip package structure or the connection between the I/O pins of the package has to be modified due to the application requirements, merely the conducting/non-conducting states of the row signal switches and the column signal switches in the arrayed switch circuit have to be controlled to redesign the routing between the chips or the routing between the I/O pins of the package without redesigning the redistribution layer. Therefore, the goals of reducing product development time and reducing research and development costs may be achieved. In addition, the switching element of the present disclosure may be applied to each of the row signal switches and the column signal switches in the arrayed switching circuit, and the threshold voltage of the transistor is decreased by changing the body terminal voltage of the transistor of the switching element. When the threshold voltage of the transistor decreases and the drain voltage of the transistor does not change, the current flowing through the transistor increases and the channel resistance of the transistor decreases. When the channel resistance decreases, the time constant of the signal decreases, and the charging and discharging speed of the transistor of the switching element increases, so that the channel bandwidth may be broader.

What is claimed is:
1. An arrayed switch circuit comprising:
a substrate;

a plurality of signal conductive pads disposed on the substrate at intervals, wherein the plurality of signal conductive pads are arranged on the substrate to form a signal conductive pad array, each of the plurality of signal conductive pads has a row position and a column position in the signal conductive pad array, a row signal switch is provided between any two adjacent signal conductive pads corresponding to the same row position, and a column signal switch is provided between any two adjacent signal conductive pads corresponding to the same column position;

a plurality of signal expansion pins connected to the signal conductive pads located on at least one side of the signal conductive pad array through a plurality of signal expansion switches respectively, and a plurality of power conductive pads and a plurality of power expansion pins, wherein the plurality of power conductive pads are disposed on the substrate at intervals and arranged on the substrate to form an power conductive pad array, each of the plurality of power conductive pads has a row position and a column position in the power conductive pad array, a row power switch is provided between any two adjacent power conductive pads corresponding to the same row position, a column power switch is provided between any two adjacent power conductive pads corresponding to the same column position, and the plurality of power expansion pins are disposed on the substrate at intervals and connected to the plurality of power conductive pads located on one side of the power conductive pad array through a plurality of power expansion switches respectively.

2. The arrayed switch circuit according to claim 1, wherein the at least one side of the signal conductive pad array comprises two opposite sides, and two of the plurality of signal expansion pins respectively close to the opposite sides are connected to each other by a row signal transmission shortcut.

3. The arrayed switch circuit according to claim 1, wherein the substrate is a first substrate, the plurality of signal conductive pads are a plurality of first signal conductive pads, the plurality of first signal conductive pads are arranged on the first substrate to form a first signal conductive pad array, the plurality of signal expansion pins are a plurality of first signal expansion pins, the plurality of row signal switches are a plurality of first row signal switches, the plurality of column signal switches are a plurality of first column signal switches, the arrayed switch circuit further comprises a second substrate and a plurality of second signal conductive pads, the second substrate and the first substrate are not coplanar, the plurality of second signal conductive pads are disposed on the second substrate at intervals and arranged on the second substrate to form a second signal conductive pad array, each of the plurality of second signal conductive pads has a row position and a column position in the second signal conductive pad array, a second row signal switch is provided between two adjacent second signal conductive pads corresponding to the same row position, a second column signal switch is provided between two adjacent second signal conductive pads corresponding to the same column position, and the plurality of second signal conductive pads are respectively connected to the plurality of first signal conductive pads through a plurality of conductive vias.

4. The arrayed switch circuit according to claim 1, wherein the substrate is a first substrate, the plurality of signal conductive pads are a plurality of first signal conductive pads, the plurality of first signal conductive pads are arranged on the first substrate to form a first signal conductive pad array, the plurality of signal expansion pins are a plurality of first signal expansion pins, the plurality of row signal switches are a plurality of first row signal switches, the plurality of column signal switches are a plurality of first column signal switches, the plurality of signal expansion switches are a plurality of first signal expansion switches, the arrayed switch circuit further comprises a second substrate, a plurality of second signal conductive pads and a plurality of second signal expansion pins, the first substrate and the second substrate are coplanar, the plurality of second signal conductive pads are disposed on the second substrate at intervals and arranged on the second substrate to form a second signal conductive pad array, each of the plurality of second signal conductive pads has a row position and a column position in the second signal conductive pad array, a second row signal switch is provided between two adjacent second signal conductive pads corresponding to the same row position, a second column signal switch is provided between two adjacent second signal conductive pads corresponding to the same column position, and the plurality second signal expansion pins are electrically connected respectively to the second signal conductive pads located on one side of the second signal conductive pad array, and the plurality of second signal expansion pins are respectively connected to the plurality of first signal expansion pins.

5. A system chip package structure, comprising:
a redistribution layer;
a plurality of chips connected to the redistribution layer;
the arrayed switch circuit according to claim 1, wherein the plurality of signal conductive pads of the arrayed switch circuit are connected to the plurality of chips through the redistribution layer, and the redistribution layer is located above the arrayed switch circuit; and
a through silicon via layer, wherein the through silicon via layer is connected to the plurality of signal conductive pads, and the through silicon via layer is located below the arrayed switch circuit.

* * * * *